United States Patent
Kim et al.

(10) Patent No.: US 12,418,094 B2
(45) Date of Patent: Sep. 16, 2025

(54) ANTENNA PACKAGE AND IMAGE DISPLAY DEVICE INCLUDING THE SAME

(71) Applicant: DONGWOO FINE-CHEM CO., LTD., Jeollabuk-do (KR)

(72) Inventors: Young Ju Kim, Gyeonggi-do (KR); Dong Pil Park, Incheon (KR); Byung Jin Choi, Incheon (KR); Na Yeon Kim, Seoul (KR); Han Sub Ryu, Gyeongsangbuk-do (KR)

(73) Assignee: DONGWOO FINE-CHEM CO., LTD., Jeollabuk-Do (KR)

( * ) Notice: Subject to any disclaimer, the term of this patent is extended or adjusted under 35 U.S.C. 154(b) by 283 days.

(21) Appl. No.: 18/125,271

(22) Filed: Mar. 23, 2023

(65) Prior Publication Data
US 2023/0231294 A1    Jul. 20, 2023

Related U.S. Application Data

(63) Continuation of application No. PCT/KR2021/012452, filed on Sep. 14, 2021.

(30) Foreign Application Priority Data

Sep. 29, 2020    (KR) .......................... 10-2020-0126493

(51) Int. Cl.
*H01Q 1/38*    (2006.01)
*H01Q 1/22*    (2006.01)
(Continued)

(52) U.S. Cl.
CPC .......... *H01Q 1/2266* (2013.01); *H01Q 1/2283* (2013.01); *H01Q 1/38* (2013.01);
(Continued)

(58) Field of Classification Search
CPC ...... H01Q 1/2283; H01Q 1/242; H01Q 1/243; H01Q 1/38; H05K 3/4691; H05K 2201/05
See application file for complete search history.

(56) References Cited

U.S. PATENT DOCUMENTS 7,265,719 B1 *    9/2007    Moosbrugger ...... H01Q 21/065
                                                                343/893
2012/0056796 A1 *    3/2012    Kato ........................ H01Q 7/00
                                                                343/788
(Continued)

FOREIGN PATENT DOCUMENTS

JP    2010-538542 A    12/2010
JP    2012-54173 A    3/2012
(Continued)

OTHER PUBLICATIONS

International Search Report for PCT/KR2021/012452 mailed on Dec. 23, 2021.
(Continued)

*Primary Examiner* — Jason M Crawford
(74) *Attorney, Agent, or Firm* — The PL Law Group, PLLC

(57) ABSTRACT

An antenna package includes a first antenna device including a first antenna unit, a second antenna device disposed at a level different from that of the first antenna device, the second antenna device including a second antenna unit that has a radiation direction different from that of the first antenna unit, a first circuit board electrically connected to the first antenna unit, a second circuit board electrically connected to the second antenna unit, and a third circuit board electrically and independently connected to the first circuit board and the second circuit board, the third circuit board having at least one antenna driving integrated circuit (IC) chip mounted thereon.

15 Claims, 6 Drawing Sheets

(51) Int. Cl.
  *H01Q 1/24*   (2006.01)
  *H04M 1/02*   (2006.01)
  *H05K 3/46*   (2006.01)
  *H05K 1/02*   (2006.01)

(52) U.S. Cl.
  CPC ........ *H04M 1/0277* (2013.01); *H05K 3/4691* (2013.01); *H01Q 1/243* (2013.01); *H05K 1/0216* (2013.01); *H05K 2201/05* (2013.01)

(56) References Cited

U.S. PATENT DOCUMENTS

| | | | |
|---|---|---|---|
| 2019/0116660 A1* | 4/2019 | Morning-Smith | H05K 1/189 |
| 2019/0229404 A1* | 7/2019 | Xia | H01Q 21/205 |
| 2019/0229405 A1* | 7/2019 | Xia | H01Q 21/065 |
| 2020/0112081 A1* | 4/2020 | Kim | H01L 24/16 |
| 2021/0051797 A1* | 2/2021 | Han | H05K 1/147 |
| 2021/0242569 A1* | 8/2021 | Fujii | H01Q 21/08 |
| 2021/0242593 A1* | 8/2021 | Im | H01L 23/5385 |
| 2021/0329777 A1* | 10/2021 | Min | H01Q 9/0407 |
| 2022/0131279 A1* | 4/2022 | Kim | H01Q 21/24 |
| 2022/0158329 A1* | 5/2022 | Choi | H01Q 5/22 |
| 2022/0190467 A1* | 6/2022 | Kim | H01Q 21/08 |
| 2022/0216587 A1* | 7/2022 | Choi | H01Q 1/38 |
| 2022/0229472 A1* | 7/2022 | Lee | H01Q 1/243 |
| 2022/0263276 A1* | 8/2022 | Kim | H01R 12/79 |
| 2023/0006349 A1* | 1/2023 | Lee | H01Q 21/24 |
| 2023/0019158 A1* | 1/2023 | Kim | H01Q 1/2283 |
| 2023/0043504 A1* | 2/2023 | Kim | H05K 1/112 |
| 2023/0231294 A1* | 7/2023 | Kim | H01Q 1/2266 343/702 |
| 2023/0231298 A1* | 7/2023 | Choi | H01Q 21/08 343/702 |
| 2023/0231322 A1* | 7/2023 | Jung | H01Q 9/28 343/702 |
| 2023/0328887 A1* | 10/2023 | Kim | H01Q 21/08 |
| 2024/0072415 A1* | 2/2024 | Peng | H01Q 21/24 |
| 2024/0291168 A1* | 8/2024 | Kim | H01Q 21/245 |

FOREIGN PATENT DOCUMENTS

| | | |
|---|---|---|
| KR | 10-2010-0101473 A | 9/2010 |
| KR | 10-2013-0095451 A | 8/2013 |
| KR | 10-2019-0019802 A | 2/2019 |
| KR | 10-2020-0016003 A | 2/2020 |
| KR | 10-2020-0038797 A | 4/2020 |
| KR | 10-2020-0038836 A | 4/2020 |
| KR | 10-2020-0087511 A | 7/2020 |

OTHER PUBLICATIONS

Office action issued on Mar. 4, 2025 from Japan Intellectual Property Office in a counterpart Japanese Patent Application No. 2023-519307 (all the cited references are listed in this IDS.) (English translation is also submitted herewith.).

Office action issued on Jun. 17, 2025 from Japan Intellectual Property Office in a counterpart Japanese Patent Application No. 2023-519307 (all the cited references are listed in this IDS.) (English translation is also submitted herewith.).

* cited by examiner

ANTENNA PACKAGE AND IMAGE DISPLAY DEVICE INCLUDING THE SAME

CROSS-REFERENCE TO RELATED APPLICATION AND CLAIM OF PRIORITY

The present application is a continuation application to International Application No. PCT/KR2021/012452 with an International Filing Date of Sep. 14, 2021, which claims the benefit of Korean Patent Application No. 10-2020-0126493 filed on Sep. 29, 2020 at the Korean Intellectual Property Office, the disclosures of which are incorporated by reference herein in their entirety.

BACKGROUND

1. Field

The present invention relates to an antenna package and an image display device including the same. More particularly, the present invention relates to an antenna package including an antenna device and an intermediate structure and an image display device including the same.

2. Description of the Related Art

As information technologies have been developed, a wireless communication technology such as Wi-Fi, Bluetooth, etc., is combined with an image display device in, e.g., a smartphone form. In this case, an antenna may be combined with the image display device to provide a communication function.

According to developments of a mobile communication technology, an antenna capable of implementing, e.g., high frequency or ultra-high frequency band communication is needed in the display device.

However, when a driving frequency of the antenna increases, a signal interference and a signal loss may also be increased. Further, when a plurality of the antenna devices are included to improve antenna radiation performance, the signal interference and the signal loss between the plurality of the antenna devices may be further increased.

Thus, a construction of an antenna package capable of preventing the signal interference and the signal loss while implementing high frequency or ultra-high frequency radiation properties using the plurality of the antenna devices.

SUMMARY

According to an aspect of the present invention, there is provided an antenna package having improved radiation property and signaling efficiency.

According to an aspect of the present invention, there is provided an image display device including an antenna package with improved radiation property and signaling efficiency.

(1) An antenna package, including: a first antenna device including a first antenna unit: a second antenna device disposed at a level different from that of the first antenna device, the second antenna device including a second antenna unit that has a radiation direction different from that of the first antenna unit; a first circuit board electrically connected to the first antenna unit: a second circuit board electrically connected to the second antenna unit; and a third circuit board electrically and independently connected to the first circuit board and the second circuit board, the third circuit board having at least one antenna driving integrated circuit (IC) chip mounted thereon.

(2) The antenna package of the above (1), wherein the first antenna unit includes a first radiator radiating in a vertical direction with respect to a top surface of the third circuit board.

(3) The antenna package of the above (2), wherein the second antenna unit includes a second radiator radiating in a horizontal direction with respect to the top surface of the third circuit board.

(4) The antenna package of the above (3), wherein the first radiator has a mesh structure, and the second radiator has a solid structure.

(5) The antenna package of the above (2), wherein the second antenna unit includes a second radiator radiating in a direction perpendicular to the top surface of the third circuit board and opposite to a radiation direction of the first radiator.

(6) The antenna package of the above (1), wherein the antenna driving IC chip includes a first antenna driving IC chip and a second antenna driving IC chip which are separately disposed on the third circuit board, and the first antenna driving IC chip and the second antenna driving IC chip are coupled to the first circuit board and the second circuit board, respectively.

(7) The antenna package of the above (6), further including: a first connector disposed on the first circuit board and electrically connected to the first antenna unit; and a second connector disposed on the second circuit board and electrically connected to the second antenna unit.

(8) The antenna package of the above (7), further including: a third connector disposed on the third circuit board and coupled to the first connector to electrically connect the first antenna unit and the first antenna driving IC chip with each other; and a fourth connector disposed on the third circuit board and coupled to the second connector to electrically connect the second antenna unit and the second antenna driving IC chip with each other.

(9) The antenna package of the above (1), wherein the first circuit board and the second circuit board are flexible printed circuit boards (FPCBs), and the third circuit board is a rigid printed circuit board.

(10) The antenna package of the above (1), wherein the first antenna device further includes a first dielectric layer on which the first antenna unit is disposed, and the second antenna device further includes a second dielectric layer on which the second antenna unit is disposed.

(11) The antenna package of the above (10), wherein the first circuit board is integral with the first dielectric layer, and the second circuit board is integral with the second dielectric layer.

(12) The antenna package of the above (1), further including a circuit device or control device mounted on the third circuit board.

(13) An image display device, including: a display panel; and an antenna package of the above-described embodiments combined with the display panel.

(14) The image display device of the above (13), wherein the first antenna unit includes a first radiator radiating in an upward direction from a top surface of the display panel, and the second antenna unit includes a second radiator radiating in a lateral side direction of the display panel or in a downward direction from a bottom surface of the display panel.

(15) The image display device of the above (14), wherein the third circuit board is disposed under the display panel, and the first circuit board is bent to extend from the top surface of the display panel along a lateral surface and the bottom surface of the display panel to be electrically connected to the third circuit board.

(16) The image display device of the above (14), wherein the second circuit board is bent to extend from the lateral surface of the display panel to the bottom surface of the display panel to be electrically connected to the third circuit board.

According to embodiments of the present invention, a first antenna device and a second antenna device may be included in one antenna package, and the first antenna device and the second antenna device may be electrically connected to a third circuit board on which an antenna driving integrated circuit chip is mounted via a first circuit board and a second circuit board, respectively. For example, a multi-axis directional signal transmission and reception may be implemented in one antenna package, and thus a dual radiation for a high frequency or ultra-high frequency and a broadband signal may be implemented.

In some embodiments, the first antenna device may be disposed on a top surface of a display panel, and the second antenna device may be disposed on a lateral surface or a bottom surface of the display panel. Accordingly, the dual radiation in different directions may be implemented in one antenna package while minimizing signal interference and signal loss. Additionally, a plurality of the antenna devices may be spatially separated, so that a resonance frequency of a band with less signal interference may be selectively used, or a synthesis of a plurality of resonance frequencies may be transmitted and received.

In some embodiments, the first circuit board and the second circuit board may be electrically and independently connected to the third circuit board through a connector. Accordingly, a stable circuit board connection may be implemented without a bonding process or an adhesive process.

The antenna package may be applied to a display device including a mobile communication device capable of transmitting and receiving signals in a 3G, 4G, 5G or higher high-frequency or ultra-high frequency band to improve optical properties such as a transmittance and radiation properties.

DETAILED DESCRIPTION OF THE EMBODIMENTS

According to embodiments of the present invention, an antenna package including a plurality of antenna devices and a circuit board electrically connected to the antenna devices is provided. According to embodiments of the present invention, an image display device including the antenna package is also provided.

The antenna devices may be, e.g., a microstrip patch antenna manufactured in the form of a transparent film, a monopole antenna or a dipole antenna. The antenna devices may be applied, e.g., to communication devices for high-frequency or ultra-high frequency (e.g., 3G, 4G, 5G or higher) communication. However, the application of the antenna device is not limited to a display device, and the antenna device may be applied to various structures such as a vehicle, a home appliance, an architecture, etc.

Hereinafter, the present invention will be described in detail with reference to the accompanying drawings. However, those skilled in the art will appreciate that such embodiments described with reference to the accompanying drawings are provided to further understand the spirit of the present invention and do not limit subject matters to be protected as disclosed in the detailed description and appended claims.

The terms "upper", "lower", "top", "bottom", "front", "rear", etc., as used herein do not designate absolute positions, but are intended to distinguish different components or relative positions.

Figure 1:
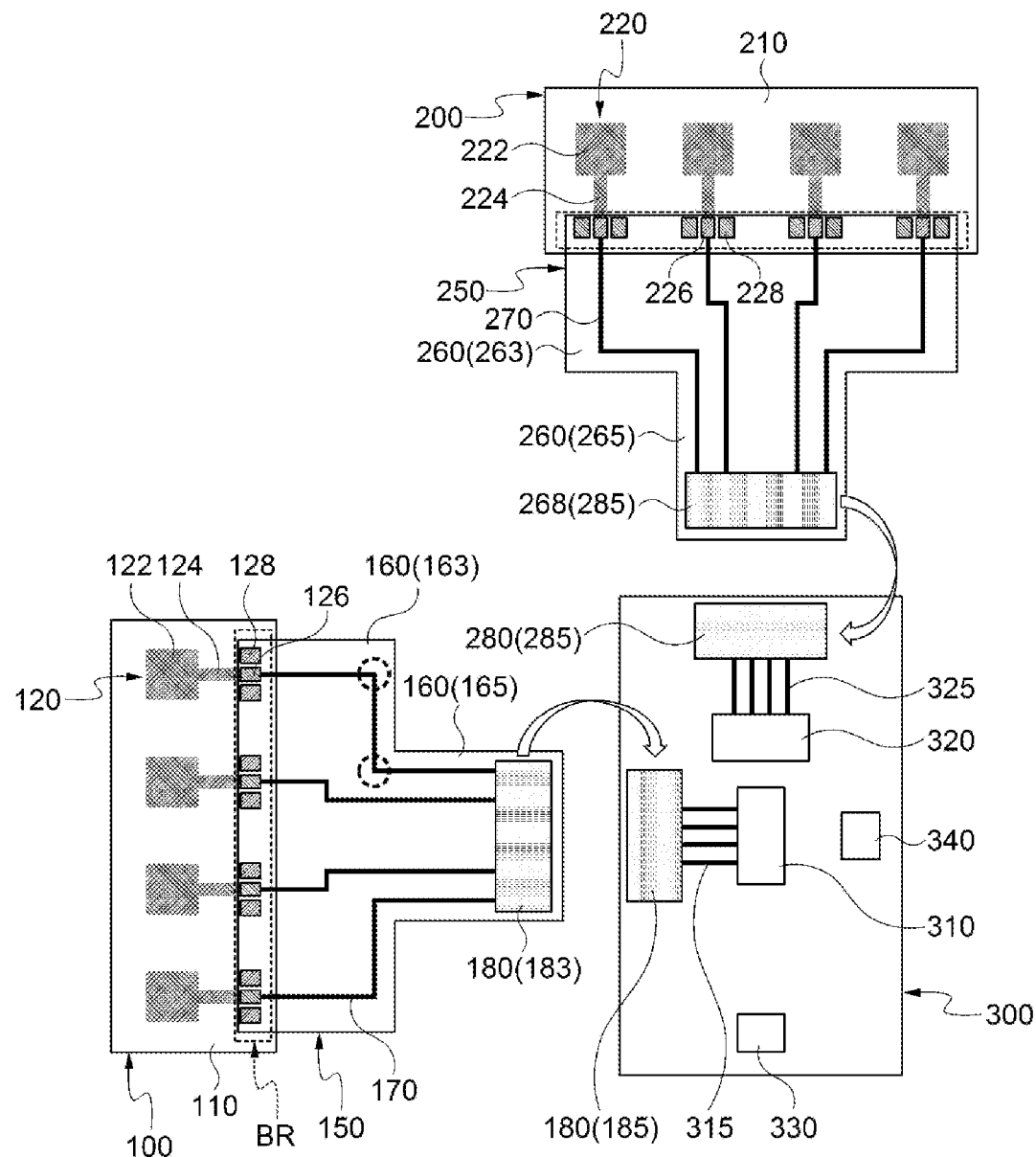
FIGS. 1 and 2 are schematic plan views illustrating antenna packages in accordance with exemplary embodiments.
Figure 2:
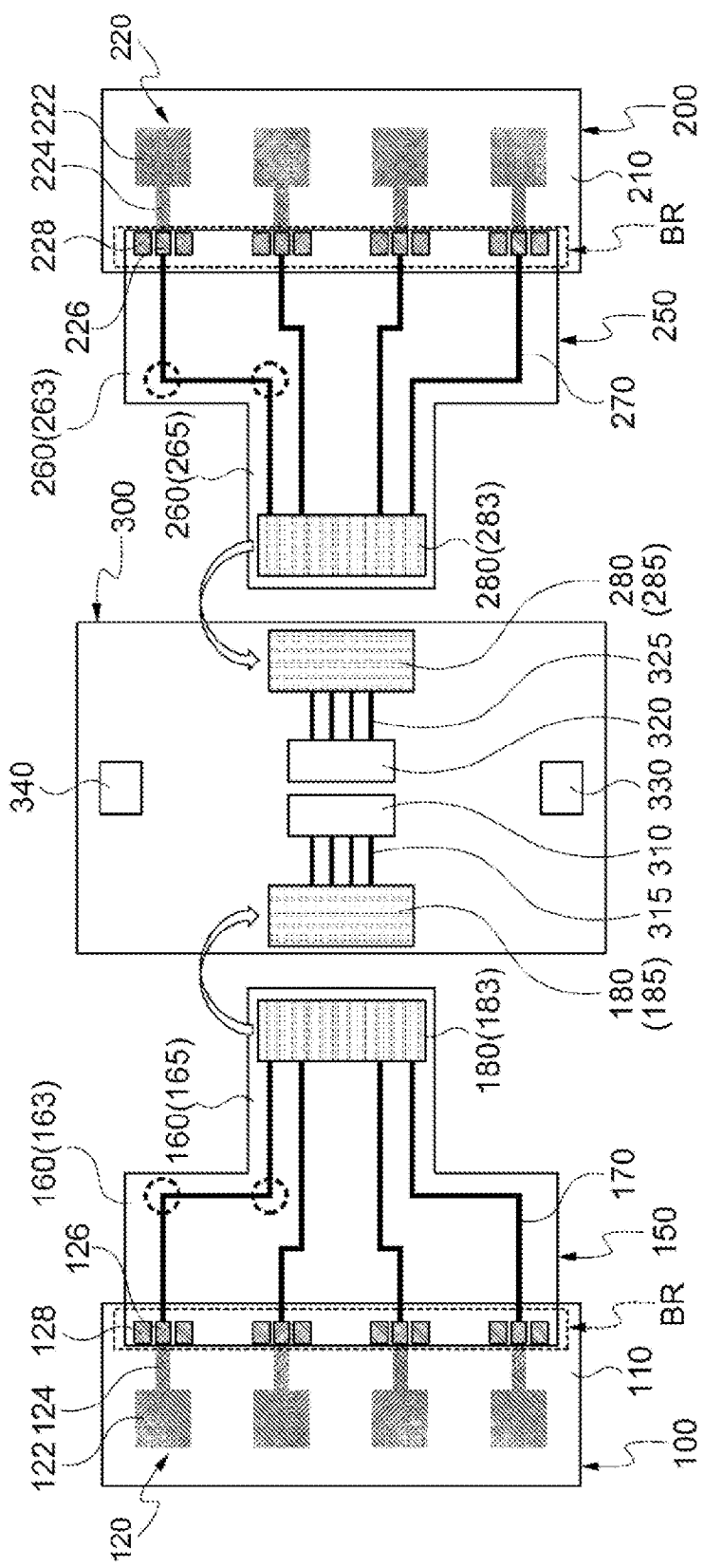

FIGS. 1 and 2 are schematic plan views illustrating antenna packages in accordance with exemplary embodiments.

Referring to FIGS. 1 and 2, the antenna package may include a first antenna device 100, a second antenna device 200 located at a different level from the first antenna device and having a radiation direction different from that of the first antenna device 100, a first circuit board 150 electrically connected to the first antenna device 100, a second circuit board 250 electrically connected to the second antenna device 200, and a third circuit board electrically and independently connected to the first circuit board 150 and the second circuit board 250.

The first antenna device 100 and the second antenna device 200 may include a first antenna unit 120 disposed on a first antenna dielectric layer 110 and a second antenna unit 220 disposed on the second antenna dielectric layer 210, respectively.

The antenna dielectric layers 110 and 210 may include an insulating material having a predetermined dielectric range. For example, the antenna dielectric layers 110 and 210 may include a transparent and flexible resin material capable of being folded. For example, the antenna dielectric layers 110 and 210 may include a polyester-based resin such as polyethylene terephthalate, polyethylene isophthalate, polyethylene naphthalate and polybutylene terephthalate: a cellulose-based resin such as diacetyl cellulose and triacetyl cellulose: a polycarbonate-based resin; an acrylic resin such as polymethyl (meth)acrylate and polyethyl(meth)acrylate: a styrene-based resin such as polystyrene and an acrylonitrile-styrene copolymer: a polyolefin-based resin such as polyethylene, polypropylene, a cycloolefin or polyolefin having a norbornene structure and an ethylene-propylene copolymer: a vinyl chloride-based resin; an amide-based resin such as nylon and an aromatic polyamide: an imide-based resin: a polyethersulfone-based resin: a sulfone-based resin; a polyether ether ketone-based resin; a polyphenylene sulfide resin: a vinyl alcohol-based resin: a vinylidene chloride-based resin; a vinyl butyral-based resin: an allylate-based resin: a polyoxymethylene-based resin: an epoxy-based resin; a urethane or acrylic urethane-based resin; a silicone-based resin, etc. These may be used alone or in a combination of two or more therefrom.

In some embodiments, an adhesive film such as an optically clear adhesive (OCA) or an optically clear resin (OCR) may be included in the antenna dielectric layers 110 and 210.

In some embodiments, the antenna dielectric layers 110 and 210 may include an inorganic insulating material such as silicon oxide, silicon nitride, silicon oxynitride, glass, etc.

In some embodiments, a dielectric constant of the antenna dielectric layers 110 and 210 may be adjusted in a range from about 1.5 to about 12. When the dielectric constant exceeds about 12, a signal loss through a transmission line may be excessively increased to degrade sensitivity and signaling efficiency in a high or ultra-high frequency band.

The first antenna unit 120 and the second antenna unit 220 may be formed on top surfaces of the first antenna dielectric layer 110 and the second antenna dielectric layer 210, respectively.

For example, a plurality of the first antenna units 120 may be arranged in an array form along a width direction of the first antenna dielectric layer 110 or the first antenna device 100 to form a first antenna unit row.

For example, a plurality of the second antenna units 220 may be arranged in an array form along the width direction of the second antenna dielectric layer 210 or the second antenna device 200 to form a second antenna unit row.

The first antenna unit 120 of the first antenna device 100 may include a first radiator 122 and a first transmission line 124. The second antenna unit 220 of the second antenna device 200 may include a second radiator 222 and a second transmission line 224.

The radiators 122 and 222 may have, e.g., a polygonal plate shape, and the first transmission line 124 and the second transmission line 224 may extend from one side of the first radiator 122 and the second radiator 222, respectively. The transmission lines 124 and 224 may be formed as a single member substantially integral with the radiators 122 and 222.

In exemplary embodiments, the radiators 122 and 222 may provide signal transmission and reception in a high frequency or ultra-high frequency (e.g., 3G, 4G, 5G or higher) band. As a non-limiting example, a resonance frequency of the antenna units 120 and 220 may be in a range from about 24 GHz to 29.5 GHZ, and/or from about 37 GHz to 45 GHz.

In exemplary embodiments, an operable resonance frequency of the radiators 122 and 222 may be controlled by adjusting an area of each radiator.

In some embodiments, the first antenna unit 120 of the first antenna device 100 and the second antenna unit 220 of the second antenna device 200 may have different resonance frequencies. In this case, e.g., transmission and reception of two different types of signals may be implemented in one antenna package, and thus transmission and reception of high-frequency or ultra-high frequency, and broadband signals can be implemented simultaneously.

The first antenna unit 120 and the second antenna unit 220 may further include a first signal pad 126 and a second signal pad 226, respectively. The first signal pad 126 and the second signal pad 226 may be connected to one end portions of the first transmission line 124 and the second transmission line 224, respectively.

In some embodiments, the first signal pad 126 and the second signal pad 226 may be provided as integral members with the first transmission line 124 and the second transmission line 224, respectively, and terminal end portions of the first transmission line 124 and the second transmission line 224 may serve as the first signal pad 126 and the second signal pad 226, respectively.

In some embodiments, a first ground pad 128 and a second ground pad 228 may be disposed around the first signal pad 126 and the second signal pad 226, respectively.

For example, a pair of the first ground pads 128 may be disposed to face each other with the first signal pad 126 interposed therebetween. A pair of the second ground pads 228 may be disposed to face each other with the second signal pad 226 interposed therebetween.

The first ground pad 128 may be electrically and physically separated from the first transmission line 124 and the first signal pad 126. The second ground pad 228 may be electrically and physically separated from the second transmission line 224 and the second signal pad 226. Thus, noises generated when radiation signals are transmitted and received through the signal pads 126 and 226 may be effectively filtered or reduced.

In this case, the first ground pad 128 and the second ground pad 228 may also serve as ground layers for the first radiator 122 and the second radiator 222, respectively, and vertical radiations may be implemented by the radiators 122 and 222.

In some embodiments, a separate ground layer may be formed under the radiators 122 and 222, and a conductive member of the display device to which the antenna device is applied may serve as the ground layer for the radiators 122 and 222.

The conductive member may include, e.g., a gate electrode of a thin film transistor (TFT) included in a display panel, various wirings such as a scan line or a data line, or various electrodes such as a pixel electrode and a common electrode.

In an embodiment, various structures including a conductive material disposed, e.g., under the display panel may serve as the ground layer. For example, a metal plate (e.g., a stainless steel plate such as a SUS plate), a pressure sensor, a fingerprint sensor, an electromagnetic wave shielding layer, a heat dissipation sheet, a digitizer, etc., may serve as the ground layer.

The antenna unit may include silver (Ag), gold (Au), copper (Cu), aluminum (Al), platinum (Pt), palladium (Pd), chromium (Cr), titanium (Ti), tungsten (W), niobium (Nb), tantalum (Ta), vanadium (V), iron (Fe), manganese (Mn), cobalt (Co), nickel (Ni), zinc (Zn), tin (Sn), molybdenum (Mo), calcium (Ca) or an alloy containing at least one of the metals. These may be used alone or in a combination therefrom.

For example, the antenna units 120 220 may include silver (Ag) or a silver alloy (e.g., silver-palladium-copper (APC)), or copper (Cu) or a copper alloy (e.g., a copper-calcium (CuCa)) to implement a low resistance and a fine line width pattern.

In some embodiments, the antenna units 120 and 220 may include a transparent conductive oxide such as indium tin oxide (ITO), indium zinc oxide (IZO), zinc oxide (ZnOx), indium zinc tin oxide (IZTO), etc.

In some embodiments, the antenna unit 120 and 220 may include a stacked structure of a transparent conductive oxide layer and a metal layer. For example, the antenna unit may include a double-layered structure of a transparent conductive oxide layer-metal layer, or a triple-layered structure of a transparent conductive oxide layer-metal layer-transparent conductive oxide layer. In this case, flexible property may be improved by the metal layer, and a signal transmission speed may also be improved by a low resistance of the metal layer. Corrosive resistance and transparency may be improved by the transparent conductive oxide layer.

The antenna units 120 and 220 may each include a blackened portion, so that a reflectance at surfaces of the antenna units 120 and 220 may be decreased to suppress a visual recognition of the antenna units 120 and 220 due to a light reflectance.

In an embodiment, a surface of the metal layer included in the antenna units 120 and 220 may be converted into a metal oxide or a metal sulfide to form a blackened layer. In an embodiment, a blackened layer such as a black material coating layer or a plating layer may be formed on the antenna units 120 and 220 or the metal layer. The black material or plating layer may include silicon, carbon, copper, molybdenum, tin, chromium, molybdenum, nickel, cobalt, or an oxide, sulfide or alloy containing at least one therefrom.

A composition and a thickness of the blackened layer may be adjusted in consideration of a reflectance reduction effect and an antenna radiation property.

In some embodiments, the first radiator 122 and the first transmission line 124 may include a mesh-pattern structure to improve transmittance. In this case, a dummy mesh electrode (not illustrated) may be formed around the first radiator 122 and the first transmission line 124.

The first signal pad 126 and the first ground pad 128 may be formed as a solid pattern including the above-described metal or alloy in consideration of a feeding resistance reduction, a noise absorption efficiency and an improvement of a horizontal radiation property.

In some embodiments, the first radiator 122 may have the mesh-pattern structure, and the first transmission line 124, the first signal pad 126 and the first ground pad 128 may be formed as a solid metal pattern.

In this case, the first radiator 122 may be disposed in a display area of the image display device, and the first transmission line 124, the first signal pad 126 and the first ground pad 128 may be disposed in a non-display area or a bezel area of the image display device.

In some embodiments, the second radiator 222, the second transmission line 224, the second signal pad 226 and the second ground pad 228 disposed on a lateral side or a bottom of the display panel as described below may include a solid structure formed of the above-described metal or alloy in consideration of improving a radiation performance, reducing a feeding resistance, improving a noise absorption efficiency and improving horizontal radiation properties.

In exemplary embodiments, the first circuit board 150 may include a first core layer 160 and first signal wirings 170 formed on a surface of the first core layer 160. The second circuit board 250 may include a second core layer 260 and second signal wirings 270 formed on a surface of the second core layer 260. For example, the first circuit board 150 and the second circuit board 250 may be a flexible printed circuit board (FPCB).

In some embodiments, the first antenna dielectric layer 110 may serve as the first circuit board 150. In this case, the first circuit board 150 (e.g., the first core layer 160 of the first circuit board 150) may be provided as a member substantially integral with the first antenna dielectric layer 110. Further, the first signal wiring 170 may be directly connected to the first transmission line 124, and the first signal pad 126 and the first ground pad 128 may be omitted.

In some embodiments, the second antenna dielectric layer 210 may serve as the second circuit board 250. In this case, the second circuit board 250 (e.g., the second core layer 260 of the first circuit board 250) may be provided as a substantially integral member with the second antenna dielectric layer 210. Further, the second signal wiring 270 may be directly connected to the second transmission line 224, and the second signal pad 226 and the second ground pad 228 may be omitted.

The first core layer 160 and the second core layer 260 may include a flexible resin such as a polyimide resin, MPI (Modified Polyimide), an epoxy resin, polyester, a cyclo olefin polymer (COP), a liquid crystal polymer (LCP), etc. The first core layer 160 and the second core layer 260 may include internal insulating layers included in the first circuit board 150 and the second circuit board 250, respectively.

The first and second signal wirings 170 and 270 may serve as, e.g., feeding lines. For example, the first signal wiring 170 and the second signal wiring 270 may be arranged on one surfaces (e.g., surfaces facing the antenna units 120 and 220) of the first core layer 160 and the second core layer 260, respectively.

For example, the first circuit board 150 may further include a first cover-lay film formed on the one surface of the first core layer 160 to cover the first signal wirings 170. For example, the second circuit board 250 may further include a second cover-lay film formed on the one surface of the second core layer 260 to cover the second signal wirings 270.

The first signal wiring 170 and the second signal wiring 270 may be connected or bonded to the first signal pad 126 of the first antenna unit 120 and the second signal pad 226 of the second antenna unit 220, respectively. For example, the first cover-lay film and the second cover-lay film of the first circuit board 150 and the second circuit board 250 may be partially removed to expose end portions of the first signal wiring 170 and the second signal wiring 270. The exposed end portions of the first signal wiring 170 and the second signal wiring 270 may be bonded to the first signal pad 126 and the second signal pad 226, respectively.

For example, a conductive bonding structure such as an anisotropic conductive film (ACF) may be attached on the first signal pads 126 and the second signal pads 226. Thereafter, a bonding regions BR of each of the first circuit board 150 and the second circuit board 250 where the end portions of the first antenna signal wirings 170 and the second antenna signal wirings 270 are located may be disposed on the conductive bonding structure.

The bonding regions BR of the first circuit board 150 and the second circuit board 250 may be attached to the first antenna device 100 and the second antenna device 200 through a heat treatment/pressing process, respectively. Accordingly, the first signal wirings 170 and the second signal wirings 270 may be electrically connected to the first signal pads 126 and the second signal pads 226, respectively.

As illustrated in FIGS. 1 and 2, the first signal wirings 170 may be independently connected or bonded to each of the first signal pads 126 of the first antenna unit 120. The second signal wirings 270 may be independently connected or bonded to each of the second signal pads 226 of the second antenna unit 220. In this case, feeding and control signaling may be implemented from a first antenna driving integrated circuit (IC) chip 310 and a second antenna driving IC chip 320 to the first antenna unit 120 and the second antenna unit 220, respectively.

In some embodiments, the predetermined number of the first antenna units 120 may be coupled through the first signal wiring 170, and the predetermined number of the second antenna units 220 may be coupled through the second signal wiring 270.

In some embodiments, the first circuit board 150 may be integral with the first dielectric layer 110, and the second circuit board 250 may be integral with the second dielectric layer 210. For example, the first core layer 160 may be formed as a substantially integral and unitary member with the first dielectric layer 110, and the second core layer 260 may be formed as a substantially integral and unitary member with the second dielectric layer 210. Accordingly, a heating and pressing process such as a separate bonding or adhering process may be omitted, so that signal loss and mechanical damages to the antenna devices 100 and 200 that may occur in the heating and pressing process may be prevented.

In some embodiments, the first circuit board 150 or the first core layer 160 may include a first portion 163 and a second portion 165 having different widths. The second portion 165 may have a width smaller than that of the first portion 163. The second circuit board 250 or the second core layer 260 may include a third portion 263 and a fourth portion 265 having different widths. The fourth portion 265 may have a width smaller than that of the third portion 263.

The first portion 163 and the third portion 263 may be provided as main base portions of the first circuit board 150 and the second circuit board 250, respectively. One end portions of the first portion 163 and the third portion 263 may each include the bonding region BR. For example, the first signal wirings 170 may extend from the bonding region BR toward the second portion 165 on the first portion 163. For example, the second signal wirings 270 may extend from the bonding region BR toward the fourth portion 265 on the third portion 263.

The first signal wirings 170 may include a bent portion on the first portion 163, and the second signal wiring 270 may include a bent portion on the third portion 263 as indicated by dotted circles. Accordingly, the first signal wirings 170 may extend on the relatively narrow second portion 165 with a smaller interval or a higher wiring density than that in the first portion 163. The second signal wirings 270 may extend on the relatively narrow fourth portion 265 with a smaller interval or a higher wiring density than that in the third portion 263.

The first circuit board 150 and second circuit board 250 may be electrically connected to a third circuit board 300.

In some embodiments, the second portion 165 of the first circuit board 100 may serve as a connector coupling portion. For example, the second portion 165 may be bent toward a rear portion of the image display device to be electrically connected to the third circuit board 300. Accordingly, a circuit connection of the first signal wiring 170 may be easily implemented by using the second portion 165 having a reduced width.

In some embodiments, the fourth portion 265 of the second circuit board 250 may serve as a connector coupling portion. For example, the fourth portion 265 may be bent toward the rear portion of the image display device or may extend at the rear portion to be electrically connected to the third circuit board 300. Accordingly, a circuit connection of the second signal wirings 270 may be easily implemented by using the fourth portion 265 having a reduced width.

Bonding stability with the first antenna device 100 and the second antenna device 200 may be improved using the first portion 163 and the third portion 263, respectively, having the increased width. If the antenna units 120 and 220 of the antenna devices 100 and 200 are arranged in an array form, sufficient distribution spaces for the signal wirings 170 and 270 may be achieved by the first portion 163 and the third portion 263.

In exemplary embodiments, the first circuit board 150 and the third circuit board 300 may be electrically connected to each other through a first-third circuit board connector 180.

The second circuit board 250 and the third circuit board 300 may be electrically connected to each other through the second-third circuit board connector 280.

In some embodiments, the first to third circuit board connector 180 and the second to third circuit board connector 280 may be provided as Board to Board (B2B) connectors. The first to third circuit board connector 180 may include a first connector 183 and a third connector 185, and the second to third circuit board connector 280 may include a second connector 283 and a fourth connector 285.

For example, the first to third circuit board connector 180 may be mounted through a surface mounting technology (SMT) to be electrically connected to end portions of the first signal wirings 170 on the second portion 165 of the first circuit board 150. For example, the second-third circuit board connector 280 may be mounted through a surface mounting technology (SMT) to be electrically connected to end portions of the second signal wirings 270 on the fourth portion 265.

In exemplary embodiments, the third circuit board 300 may be a main board of the image display device or may be a rigid printed circuit board. For example, the third circuit board 300 may include a resin (e.g., epoxy resin) layer impregnated with an inorganic material such as glass fiber as a base insulation layer (e.g., a prepreg), and may include circuit wiring distributed on a surface and within an inside of the base insulation layer.

In exemplary embodiments, at least one antenna driving IC chip may be mounted on the third circuit board 300.

In some embodiments, two or more antenna driving IC chips may be mounted on the third circuit board 300. In this case, two or more antenna devices may be included in one antenna package and electrically connected to the antenna driving IC chips. Accordingly, dual radiation may be implemented, and the antenna device may be disposed on a lateral side or a bottom surface of the display panel in addition to a top surface of the display panel, thereby reducing signal interference and signal loss in a high frequency or ultra-high frequency band.

In some embodiments, the antenna driving IC chip may include a first antenna driving IC chip 310 and a second antenna driving IC chip 320 combined with the first circuit board 150 and the second circuit board 250, respectively. The first antenna driving IC chip 310 and the second antenna driving IC chip 320 may be separately disposed on the third circuit board 300.

In some embodiments, the third connector 185 may be electrically connected to the first antenna driving IC chip 310 through a first connection wiring 315 included in the third circuit board 300, and the fourth connector 285 may be electrically connected to the second antenna driving IC chip 320 through a second connection wiring 325 included in the third circuit board 300.

As indicated by arrows in FIGS. 1 and 2, the first connector 183 mounted on the first circuit board 150 and the third connector 185 mounted on the third circuit board 300 may be coupled to each other. The second connector 283 mounted on the second circuit board 250 and the fourth connector 285 mounted on the third circuit board 300 may be coupled to each other. For example, the first connector 183 and the second connector 283 may be provided as plug connectors, and the third connector 185 and the fourth connector 285 may be provided as receptacle connectors.

Accordingly, a connection between the first circuit board 150 and the third circuit board 300 may be achieved through the first-third circuit board connector 180, so that an electrical connection between the first antenna unit 120 and the first antenna driving IC chip 310 may be implemented. Further, a connection between the second circuit board 250 and the third circuit board 300 may be achieved through the second-third circuit board connector 280, so that an electrical connection between the second antenna driving IC chip 320 and the second antenna unit 220 may be implemented.

Therefore, a feeding/control signals (e.g., a phase signal, a beam tilting signal, etc.) may be applied to the first antenna unit 120 and the second antenna unit 220 from the first antenna driving IC chip 310 and the second antenna driving IC chip 320, respectively.

An intermediate structure in which the first circuit board 150, the first to third circuit board connectors 180 and the third circuit board 300 are electrically connected may be formed. An intermediate structure in which the second circuit board 250, the second-third circuit board connection connector 280 and the third circuit board 300 are electrically connected may also be formed.

In some embodiments, as described above, the first circuit board 150 and the third circuit board 300 may be electrically coupled to each other, and the second circuit board 250 and the third circuit board 300 may be electrically coupled to each other using the connectors 180 and 280. Thus, the first and second circuit boards 150 and 250 and the third circuit board 300 may be easily coupled to each other using the connectors 180 and 280 without heating and pressing processes such as an additional bonding process or adhering process.

Therefore, a signal loss in the antenna units 120 and 220 may be prevented while suppressing a dielectric loss due to thermal damages to the substrate caused by the heating and pressing processes, and a resistance increase due to wiring damages.

In some embodiments, the connection between the first circuit board 150 and the third circuit board 300, and the connection between the second circuit board 250 and the third circuit board 300 may be implemented by the heating and pressing process such as the bonding or adhering process.

In this case, for example, the first antenna driving IC chip 310 and the first signal wirings 170 may be electrically connected through the first connection wirings 315 disposed on the third circuit board 300 to perform the feeding and driving control of the first antenna device 100. Additionally, for example, the second antenna driving IC chip 320 and the second signal wirings 270 may be electrically connected through the second connection wirings 325 disposed on the third circuit board 300 to perform the feeding and driving control of the second antenna device 200.

In some embodiments, a circuit device 330 and a control device 340 may be mounted on the third circuit board 300 in addition to the antenna driving IC chips 310 and 320. The circuit device 330 may include, e.g., a capacitor such as a multilayer ceramic capacitor (MLCC), an inductor, a resistor, etc. The control device 340 may include, e.g., a touch sensor driving IC chip, an application processor (AP) chip, etc.

In exemplary embodiments, the second antenna device 200 may be located at a different level from that of the first antenna device 100, and may have a radiation direction different from that of the first antenna unit 120. In this case, dual radiation in different directions may be implemented, and thus signal interference and signal loss between antenna units may be reduced, thereby improving antenna radiation performance while a plurality of antenna devices are included in one antenna package. Additionally, the plurality of antenna devices may be by spatially separated so that a resonance frequency of a band with less signal interference may be selected, or a synthesis of a plurality of resonance frequencies for transmission and reception may be implemented.

In some embodiments, the first radiator 122 of the first antenna unit 120 may radiate in a direction perpendicular to a top surface of the third circuit board 300.

As illustrated in FIG. 1, in some embodiments, the second radiator 222 of the second antenna unit 220 may radiate in a horizontal direction with respect to the top surface of the third circuit board 300. In this case, the dual radiation may be implemented on the top and lateral surfaces of the image display device. For example, the location levels and radiation directions of the antenna devices 100 and 200 are different by an angle of about 90 degrees, so that the signal interference and signal loss can be reduced.

As illustrated in FIG. 2, in some embodiments, the second radiator 222 of the second antenna unit 220 may radiate in a direction perpendicular to the top surface of the third circuit board 300 and opposite to a radiation direction of the first radiator 122. In this case, the dual radiation can be implemented on the top and bottom surfaces of the image display device. For example, the location levels and radiation directions of the antenna devices 100 and 200 are different by an angle of about 180 degrees, so that the signal interference and signal loss can be reduced.

In some embodiments, the antenna units 120 and 220 of the antenna devices 100 and 200 may have different resonance frequencies. Accordingly, transmission and reception of a plurality of resonance frequencies in the high frequency or ultra-high frequency band may be implemented while suppressing the signal interference and signal loss between the antenna devices.

Hereinafter, an image display device including an antenna package according to exemplary embodiments will be described with reference to FIGS. 3 to 5.

Figure 3:
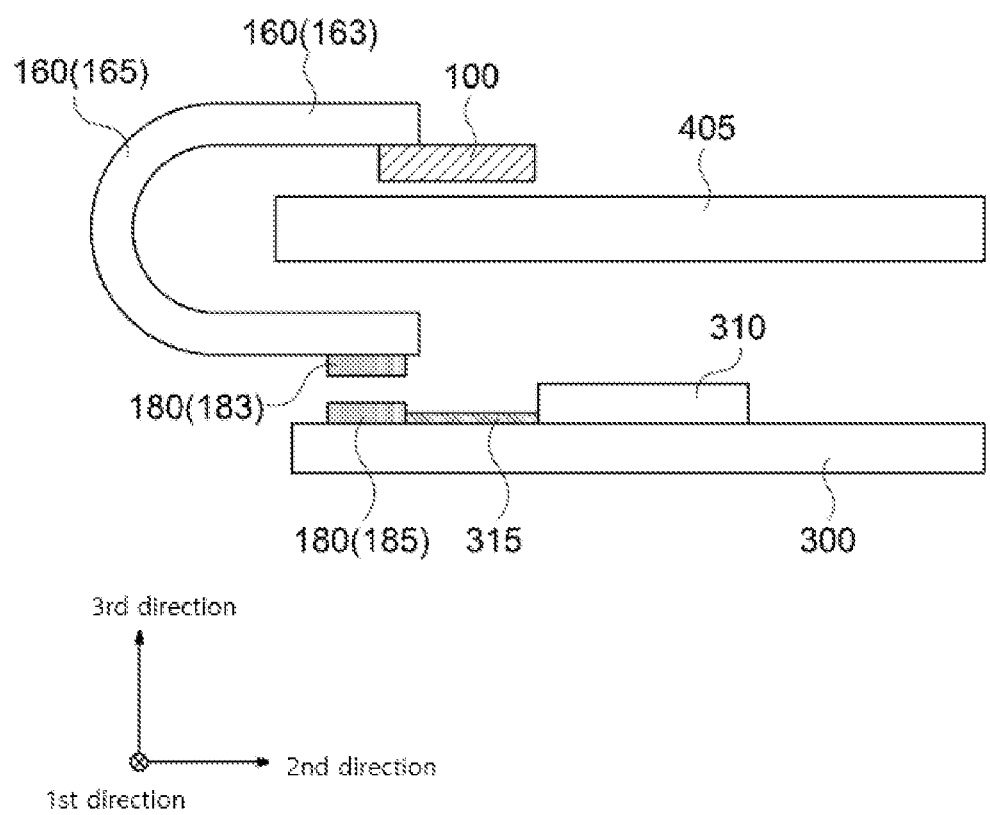
FIGS. 3 to 5 are schematic cross-sectional views illustrating an antenna package and an image display device including the same in accordance with exemplary embodiments.
Figure 4:
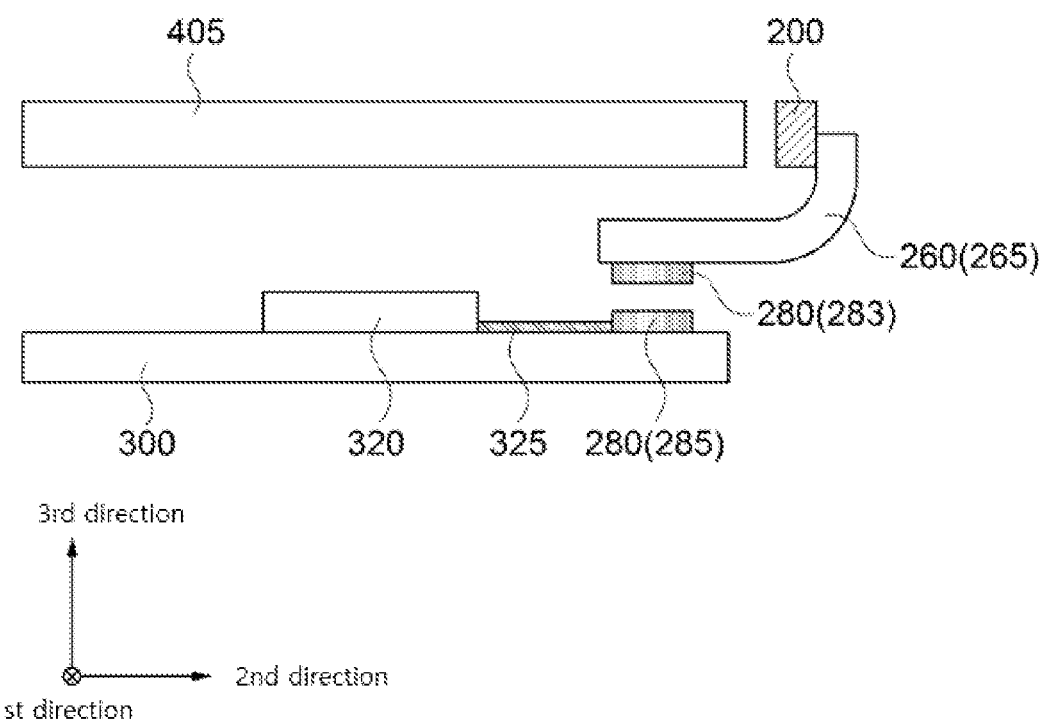
Figure 5:
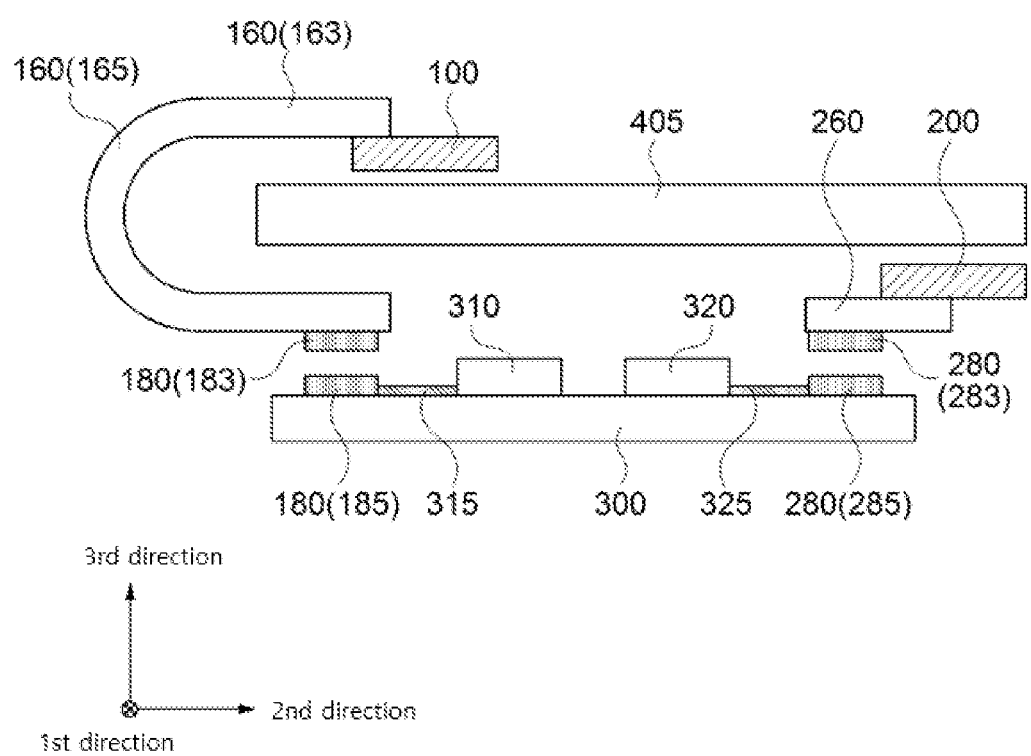

FIGS. 3 to 5 are schematic cross-sectional views illustrating an antenna package and an image display device including the same in accordance with exemplary embodiments.

Referring to FIG. 3, the first antenna device 100 according to some embodiments may be disposed on a top surface of a display panel 405 of an image display device, and the first radiator 122 of the first antenna unit 120 may radiate over the top surface of the display panel 405. In FIG. 3, illustration of the second antenna device 200, the second circuit board 250, and the second to third circuit board connectors 280 is omitted for convenience of descriptions.

In some embodiments, the first circuit board 150 electrically connected to the first antenna device 100 may be bent to extend from the top surface of the display panel 405 along lateral and bottom surfaces.

In this case, in some embodiments, the relatively narrow second portion 165 of the first circuit board 150 may be bent so that the first connector 183 may be coupled to the third connector 185 mounted on the third circuit board 300. Accordingly, the electrical connection with the third circuit board 300 disposed under the display panel 405 may be easily implemented.

Referring to FIG. 4, the second antenna device 200 according to some embodiments may be disposed on the lateral surface of a display panel 405 of the image display device, and the second radiator 222 of the second antenna unit 220 may radiate in a lateral direction of the display panel 405. In FIG. 4, illustration of the first antenna device 100, the first circuit board 150, and the first to third circuit board connector 180 is omitted for convenience of descriptions.

In some embodiments, the second circuit board 250 electrically connected to the second antenna device 200 may be bent to extend from the lateral surface of the display panel 405 along the bottom surface.

In this case, in some embodiments, the relatively narrow fourth portion 265 of the second circuit board 250 may be bent so that the second connector 283 may be coupled to the fourth connector 285 mounted on the third circuit board 300. Accordingly, the electrical connection with the third circuit board 300 disposed under the display panel 405 may be easily implemented.

Referring to FIG. 5, the second antenna device 200 according to some embodiments may be disposed on the bottom surface of the display panel 405 of the image display device, and the second radiator 222 of the second antenna unit 220 may radiate downward from the bottom surface of the display panel 405.

In some embodiments, the second circuit board 250 electrically connected to the second antenna device 200 may extend on the bottom surface of the display panel 405.

In this case, in some embodiments, the second connector 283 mounted on the relatively narrow fourth portion 265 of the second circuit board 250 may be coupled to the fourth connector 285 mounted on the third circuit board 300. Accordingly, the electrical connection between the second circuit board 250 and the third circuit board 300 may be easily implemented.

Figure 6:
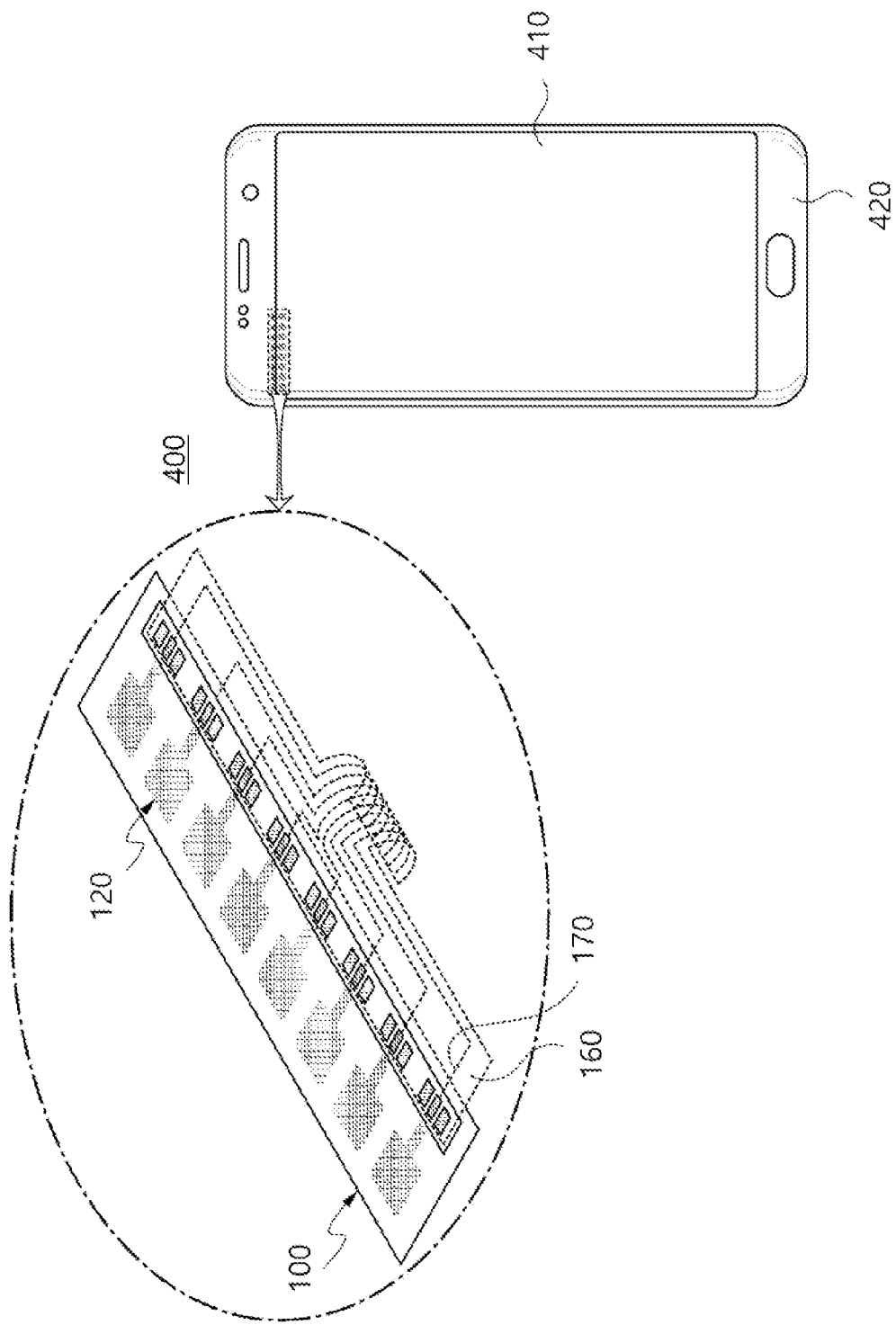
FIG. 6 is a schematic plan view illustrating an image display device in accordance with exemplary embodiments.

FIG. 6 is a schematic plan view illustrating an image display device in accordance with exemplary embodiments. In FIG. 6, illustration of the second antenna device 200 which may be located on a lateral portion or a rear portion of the image display device 400 is omitted for convenience of descriptions.

Referring to FIG. 6, an image display device 400 may be implemented in the form of, e.g., a smart phone, and FIG. 6 illustrates a front portion or a window face of the image display device 400. The front portion of the image display device 400 may include a display area 410 and a peripheral area 420. The peripheral area 420 may correspond to, e.g., a light-shielding portion or a bezel portion of the image display device.

The first antenna device 100 included in the above-described antenna package may be disposed toward the front portion of the image display device 400, and may be disposed on the top surface of the display panel 405. In some embodiments, the first radiator 122 may be at least partially superimposed over the display area 410.

In this case, the first radiator 122 may include a mesh-pattern structure, and a reduction of a transmittance due to the first radiator 122 may be prevented. The first signal pad 126 and the first ground pad 128 included in the first antenna unit 120 may be formed as solid metal patterns, and may be disposed in the peripheral area 420 to prevent degradation of an image quality.

The second antenna device 200 included in the above-described antenna package may be disposed toward the lateral or rear portion of the image display device 400, and may be disposed, e.g., on the side or bottom surface of the display panel 405.

In this case, the second radiator 222 may have a solid structure, and may provide enhanced radiation performance, noise absorption, and suppressed of signal loss.

In some embodiments, the first circuit board 150 may be bent through, e.g., the second portion 165 to extend toward the third circuit board 300 (e.g., a main board) on which the first antenna driving IC chip 310 is mounted at the rear portion of the image display device 400.

In some embodiments, the second circuit board 250 may be bent, e.g., from the lateral portion of the image display device 400 through the fourth portion 265 or may extend from the rear portion of the image display device 400 and extend toward the third circuit board 300 (e.g., a main board) on which the second antenna driving IC chip 320 is mounted at the rear portion of the image display device 400.

In some embodiments, the first circuit board 150 and the third circuit board 300 may be interconnected through the first-third circuit board connector 180, so that a feeding and an antenna driving control to the first antenna device 100 from the first antenna driving IC chip 310 may be implemented.

In some embodiments, the second circuit board 250 and the third circuit board 300 may be interconnected through the second-third circuit board connector 280, so that a feeding and an antenna driving control to the second antenna device 200 from the second antenna driving IC chip 320 may be implemented.

As described above, a plurality of antenna devices may be included in one antenna package whole being spatially separated. Accordingly, an antenna package that may reduce the signal interference and signal loss while implementing a multi-axial radiation in the high frequency or ultra-high frequency band may be implemented.

What is claimed is:

1. An antenna package comprising:
a first antenna device comprising a first antenna unit;
a second antenna device disposed at a level different from a level of the first antenna device, the second antenna device comprising a second antenna unit having a radiation direction different from a radiation direction of the first antenna unit;
a first circuit board electrically connected to the first antenna unit;
a second circuit board electrically connected to the second antenna unit; and
a third circuit board electrically and independently connected to the first circuit board and the second circuit board, the third circuit board having at least one antenna driving integrated circuit (IC) chip mounted thereon,
wherein the antenna driving IC chip comprises a first antenna driving IC chip and a second antenna driving IC chip which are separately disposed on the third circuit board, and
the first antenna driving IC chip and the second antenna driving IC chip are coupled to the first circuit board and the second circuit board, respectively.

2. The antenna package of claim 1, wherein the first antenna unit comprises a first radiator radiating in a vertical direction with respect to a top surface of the third circuit board.

3. The antenna package of claim 2, wherein the second antenna unit comprises a second radiator radiating in a horizontal direction with respect to the top surface of the third circuit board.

4. The antenna package of claim 3, wherein the first radiator has a mesh structure, and the second radiator has a solid structure.

5. The antenna package of claim 2, wherein the second antenna unit comprises a second radiator radiating in a direction perpendicular to the top surface of the third circuit board and opposite to a radiation direction of the first radiator.

6. The antenna package of claim 1, further comprising:
 a first connector disposed on the first circuit board and electrically connected to the first antenna unit; and
 a second connector disposed on the second circuit board and electrically connected to the second antenna unit.

7. The antenna package of claim 6, further comprising:
 a third connector disposed on the third circuit board and coupled to the first connector to electrically connect the first antenna unit and the first antenna driving IC chip with each other; and
 a fourth connector disposed on the third circuit board and coupled to the second connector to electrically connect the second antenna unit and the second antenna driving IC chip with each other.

8. The antenna package of claim 1, wherein the first circuit board and the second circuit board are flexible printed circuit boards (FPCBs), and the third circuit board is a rigid printed circuit board.

9. The antenna package of claim 1, wherein the first antenna device further comprises a first dielectric layer on which the first antenna unit is disposed, and the second antenna device further comprises a second dielectric layer on which the second antenna unit is disposed.

10. The antenna package of claim 9, wherein the first circuit board is integral with the first dielectric layer, and the second circuit board is integral with the second dielectric layer.

11. The antenna package of claim 1, further comprising a circuit device or control device mounted on the third circuit board.

12. An image display device comprising:
 a display panel; and
 an antenna package of claim 1 combined with the display panel.

13. The image display device of claim 12, wherein the first antenna unit comprises a first radiator radiating in an upward direction from a top surface of the display panel; and
 the second antenna unit comprises a second radiator radiating in a lateral side direction of the display panel or in a downward direction from a bottom surface of the display panel.

14. The image display device of claim 13, wherein the third circuit board is disposed under the display panel; and
 the first circuit board is bent to extend from the top surface of the display panel along a lateral surface and the bottom surface of the display panel to be electrically connected to the third circuit board.

15. The image display device of claim 13, wherein the second circuit board is bent to extend from the lateral surface of the display panel to the bottom surface of the display panel to be electrically connected to the third circuit board.

* * * * *